(12) United States Patent
Arnold et al.

(10) Patent No.: US 9,618,847 B2
(45) Date of Patent: Apr. 11, 2017

(54) COMPOSITE PRINTING FORM PRECURSOR AND METHOD FOR PREPARING A PRINTING FORM PRECURSOR FOR TREATMENT

(71) Applicant: E I DU PONT DE NEMOURS AND COMPANY, Wilmington, DE (US)

(72) Inventors: Carl Bernard Arnold, Newark, DE (US); Edmund Francis Schieffer, Jr., Wilmington, DE (US); Theodore William Frentzel, Jr., Newark, DE (US); James Kenton Odle, Newark, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/616,966

(22) Filed: Feb. 9, 2015

(65) Prior Publication Data
US 2015/0234280 A1    Aug. 20, 2015

Related U.S. Application Data

(60) Provisional application No. 61/942,270, filed on Feb. 20, 2014.

(51) Int. Cl.
G03F 7/20    (2006.01)
(52) U.S. Cl.
CPC ..................... *G03F 7/20* (2013.01)
(58) Field of Classification Search
CPC ..................................................... G03F 7/202
See application file for complete search history.

(56) References Cited

U.S. PATENT DOCUMENTS

| | | |
|---|---|---|
| 2,225,212 A | 12/1940 | Fleischmann |
| 3,060,023 A | 10/1962 | Burg et al. |
| 3,264,103 A | 8/1966 | Cohen et al. |
| 3,796,602 A | 3/1974 | Briney et al. |
| 4,744,297 A | 5/1988 | Sardella et al. |
| 5,015,556 A | 5/1991 | Martens |
| 5,175,072 A | 12/1992 | Martens |
| 5,215,859 A | 6/1993 | Martens |
| 5,279,697 A | 1/1994 | Peterson et al. |
| 6,117,615 A | 9/2000 | Riechert et al. |
| 6,244,183 B1 | 6/2001 | Haney et al. |

(Continued)

FOREIGN PATENT DOCUMENTS

| | | |
|---|---|---|
| EP | 720057 A1 | 7/1996 |
| EP | 2128698 A2 | 12/2009 |

(Continued)

OTHER PUBLICATIONS

International Search Report Dated May 4, 2015, PCT/US2015/015439.

*Primary Examiner* — Chanceity Robinson
(74) *Attorney, Agent, or Firm* — Simon L. Xu

(57) ABSTRACT

The invention relates to a method for preparing a relief printing plate from a printing plate precursor wherein at least an end of the precursor is attached to a leader forming a composite printing form precursor that securely mounts the precursor in a treatment processor. The present method advantageously allows for all or substantially all of the area of the precursor to be utilized for forming the relief surface suitable for printing.

4 Claims, 7 Drawing Sheets

(56) References Cited

U.S. PATENT DOCUMENTS

| | | | |
|---|---|---|---|
| 6,539,865 | B2 | 4/2003 | Friedman |
| 6,797,454 | B1 | 9/2004 | Johnson et al. |
| 8,397,636 | B2 | 3/2013 | Frentzel, Jr. et al. |
| 8,459,182 | B2 | 6/2013 | Odle et al. |
| 2004/0048199 | A1 | 3/2004 | Schadebrodt et al. |
| 2011/0039211 | A1* | 2/2011 | Hannum et al. ............. 430/306 |
| 2011/0275017 | A1* | 11/2011 | Tuckwiller et al. .......... 430/306 |
| 2013/0108966 | A1* | 5/2013 | Arnold .................... G03F 7/40 430/306 |

FOREIGN PATENT DOCUMENTS

| | | |
|---|---|---|
| EP | 2284609 A2 | 2/2011 |
| EP | 2385427 A2 | 11/2011 |
| JP | 53/008655 | 1/1978 |
| WO | 98/13730 | 4/1998 |
| WO | 02/068208 A1 | 9/2002 |

\* cited by examiner

COMPOSITE PRINTING FORM PRECURSOR AND METHOD FOR PREPARING A PRINTING FORM PRECURSOR FOR TREATMENT

BACKGROUND OF THE INVENTION

1. Field of the Disclosure

This invention pertains to a method for preparing a relief printing plate from a printing plate precursor, and particularly to a method for preparing the relief printing plate from the printing plate precursor that is mounted on a support surface for treatment.

2. Description of Related Art

In one process for preparing a relief printing plate from a photosensitive element, the photosensitive element or printing plate precursor is often mounted around the circumference of a rotatable drum and heated to soften unpolymerized portions of the element for removal and create a relief surface of the printing plate. During thermal processing, the drum is rotated and the heated precursor is placed in contact with a development medium, such as an absorbent material, to remove the unpolymerized portions. It is desirable for thermal processing systems to accommodate printing plate precursors of different sizes, and in particular to mount printing plate precursors having different lengths around a circumferential surface of the drum. It is also desirable for the printing plate precursor to be securely mounted to the drum since during thermal processing the printing plate precursor needs to withstand the rigors of one or more cycles of heating and separating the development medium from the precursor. Defects can be induced in the resulting relief printing plate if during thermal processing the still warm printing plate precursor lifts, sags, or bends from the drum surface. The printing precursor can lift off the drum or sag and separate from the drum surface as the medium separates from the printing plate precursor, or as the precursor rotates on the drum. Uncontrolled separation of the medium and the lifting or sagging of the precursor while still hot bends the precursor and induces strains in the structure of the printing plate precursor which creates a defect, called waves, in the resulting relief printing plate. It is also desirable to keep the printing plate precursor firmly against the drum surface, particularly if the drum surface is cooled, to prevent or minimize heating of a back side of the precursor and to keep a support on the backside below its glass transition temperature. If the support of the precursor is heated to or above its glass transition temperature during thermal processing, the support can distort and result in deformations in the final processed relief printing plate. Further, the printing plate precursor can be securely mounted in contact with the drum surface by having the precursor held tautly or in tension to the drum. But the precursor should be properly tensioned during thermal processing since the precursor can change in one or more dimensions when heated. In some instances, the precursor can expand in length when it is heated and adjustments are needed to keep the precursor taut to the drum surface. The thermal development processor is capable of adjusting so as to maintain the desired tension on the precursor throughout thermal processing and properly remove of the unpolymerized portions from the relief surface as it is generated. If the printing plate precursor is not properly tensioned around the drum, and there is too little tension, the precursor may pull away from the drum and the unpolymerized portions may not be thoroughly removed. If the tension on the precursor is too high, the precursor can permanently distort or end portions of the precursor that attach to the drum can be damaged. Additionally, if the precursor is not appreciably held in contact with the drum, the precursor can rub against other parts of the processor and damage the relatively soft printing surface.

In some instances, the defects associated with lifting, sagging, and bending of the printing plate precursor can be exacerbated if only one end, i.e., a leading end, of the printing plate precursor is held to the drum, and the end opposite the leading end, i.e., trailing end of the precursor is not securely held to the drum. As disclosed by Peterson et al. in U.S. Pat. No. 5,279,697 the printing form precursor is secured to a preheating drum with a clamp that is flush mounted transversely on an outer surface of the drum. As disclosed by Odle et al. in U.S. Pat. No. 8,459,182 the printing plate precursor is mounted on the drum with both the leading end and the trailing end of the precursor securely held to the drum so that the precursor is properly tensioned and held in contact with the drum during thermal development. The thermal processor includes a first set of pins that are transversely coupled to the drum, a movable member that extends over a portion of the drum surface, and a second set of pins that are disposed transversely on the movable member. The leading end of the precursor is securely held by the first set of pins and the trailing end of the precursor is securely held by the second set of pins.

A problem arises with securely holding one or both ends of the printing plate precursor, whether gripped by clamps or by pins, since printable images cannot be created within the area or areas that are gripped. The gripped edge portion at the end of the photopolymerizable layer of the precursor, i.e., grip zone, is covered by the clamp or interrupted by the pins and thereby limits the surface area of the photopolymerizable layer that can be utilized to form a relief surface suitable for printing. Some customers desire the ability to produce printing plates with the print image content, i.e., printing relief surface, closer to the edges of the precursor than the areas for gripping permit. Some print jobs may require that the printing plate have printing relief surface within the grip areas to the very end edge or edges of the precursor. The end or ends of the printing plate precursor that cannot contain relief image for printing is a yield loss of the printing plate precursor. In some cases, the yield loss from the imageable surface of the photopolymerizable layer captured in grip zone/s can be as much as 10%, but typically from 3.5 to 6%, of the imageable area of the precursor.

As a consequence, there remains a need to provide a method for preparing a relief printing plate which allows for the entire or substantially the entire printable surface area of the precursor to contain image content and form relief surface for printing, while still securely holding at least one end of the printing plate precursor, preferably both ends of the precursor, to the drum or support surface in a processor.

SUMMARY

It is an object of the present invention to provide a method for securely holding a printing form precursor to a support surface for processing while having capability to fully utilize all or substantially all of the printable surface area of the precursor.

It is another object of the invention that the method is adaptable to all types and designs of treatment processors, and does not necessarily require modification of the processor to securely hold the precursor during treatment.

It is yet another object of the invention to provide a method that is flexible and can be optionally used according to the needs and desires particular for each customer and each print job.

It is another object of the present invention to provide a method that is simple, economical, reliable, and effective way to hold one or both ends of the precursor for processing, but does not permanently modify the precursor or disrupt its ability to print.

In accordance with this invention there is provided a method for preparing a relief printing plate from a printing plate precursor having a leading end, a trailing end, and between the leading and trailing ends a photopolymerizable layer adjacent a base support, the photopolymerizable layer having an area that is adapted to form a relief surface suitable for printing. The method comprising the steps of attaching a leader in an extending relation to one of the leading end or trailing end of the precursor to an exterior surface of the base support opposite the photopolymerizable layer, the leader having a first end and opposite the first end, a second end having an adhesive portion; wherein one of the leading end or trailing end of the precursor contacts the adhesive portion of the leader with the first end of the leader extending from the one end of the precursor; mounting the precursor with the extending leader onto a support member of a processor by securing the first end of the leader to the support member; and treating the photopolymerizable layer of the precursor forming a printing plate having a relief surface; wherein greater than 90% of the area of the photopolymerizable layer can be utilized to form the relief surface suitable for printing.

In accordance with this invention there is provided the method for preparing a relief printing plate from a printing plate precursor having a leading end, a trailing end, and between the leading and trailing ends a photopolymerizable layer adjacent a base support, the photopolymerizable layer having an area that is adapted to form a relief surface suitable for printing. The method comprising the steps of attaching a leader in an extending relation to one of the leading end or trailing end of the precursor to an exterior surface of the base support opposite the photopolymerizable layer, the leader having a first end and opposite the first end, a second end having an adhesive portion; wherein one of the leading end or trailing end of the precursor contacts the adhesive portion of the leader with the first end of the leader extending from the one end of the precursor; and using a fixture assembly that includes a registration indicator and an alignment edge that is opposite and offset from the registration indicator. The attaching step further includes aligning the first end of the leader with the registration indicator of the fixture assembly, and extending at least a segment of the adhesive portion beyond the alignment edge of the fixture assembly; aligning the end of the precursor with the alignment edge; and, contacting the exterior surface of the end of the precursor to the at least extended segment of the adhesive portion, thereby attaching the leader to the precursor with the first end of the leader extending from and parallel to the one end of the precursor.

In accordance with another aspect of this invention there is provided a composite printing form precursor that includes a printing form precursor and a leader in an extending relation to one of the leading end or trailing end of the precursor. The printing form precursor includes a support, and a photopolymerizable layer adjacent to the support, the photopolymerizable layer having unpolymerized portions and polymerized portions that are adapted to form a relief surface suitable for printing, wherein the precursor has a leading end, a trailing end, and the photopolymerizable layer adjacent the base support is between the leading and trailing ends. The leader has an end coupled to an exterior surface of the support that is opposite the photopolymerizable layer. The composite printing form precursor provides greater than 90% of the area of the photopolymerizable layer of the precursor can be utilized to form a relief surface of the polymerized portions that are suitable for printing.

BRIEF DESCRIPTION OF THE DRAWINGS

The invention can be more fully understood from the following detailed description thereof in connection with the accompanying drawings described as follows.

DESCRIPTION OF THE PREFERRED EMBODIMENTS

Figure 1A:
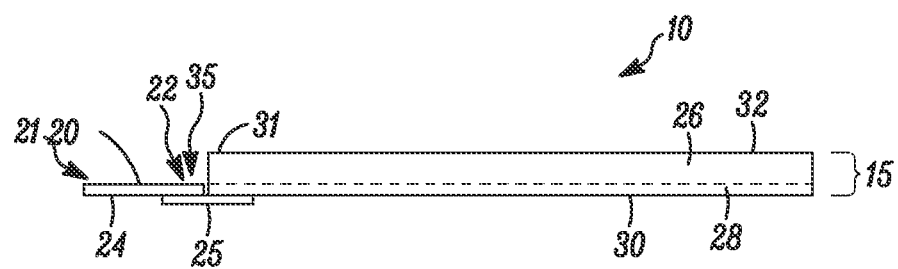
FIG. 1a is a side elevation view of one embodiment of a printing plate precursor having a leader that projects from and attaches with an adhesive tape to an end of the precursor.

Throughout the following detailed description, similar reference characters refer to similar elements in all figures of the drawings.

The invention relates to a method for preparing a printing plate from a printing plate precursor for treating in a processor or apparatus in order to form the printing plate with a relief surface that is suitable for printing. The method includes attaching flexible extensions for gripping, referred to herein as leaders, which are temporarily but securely bonded to at least one end, preferably two ends of the precursor prior to treatment processing. Typically, the leader or leaders are removed after processing and before any post-processing steps. The invention also relates to a composite printing form precursor that includes the printing plate precursor having at least one end adhesively attached in an extending relation to the leader.

The printing plate precursor may also be referred to herein as a precursor, or a photosensitive element, or a photopolymerizable element. The precursor includes at least a photopolymerizable layer adjacent a base support, and optionally may include one or more additional layers on or adjacent the photopolymerizable layer opposite the support. The precursor has a leading end and a trailing end that in this context refers to the orientation of the precursor as the precursor is being processed on a support surface of the processor. The precursor has a length between the leading and trailing ends, and a width that is perpendicular to the leading and trailing ends of the precursor. Since the precursor has a plate structure, the photopolymerizable layer has an area that is configured or adapted to form the relief surface. In most embodiments, the precursor has been exposed to actinic radiation, such as ultraviolet or visible radiation, to selectively cure or photopolymerize portions of the photopolymerizable layer. The selectively exposed precursor includes unpolymerized portions and polymerized portions that are adapted or can be configured to form a relief surface suitable for printing. The treating step removes portions of the photopolymerizable layer that were not exposed to actinic radiation, and thereby forms the relief surface of the polymerized portions of the layer in the resulting printing plate that is suitable for printing.

The method provides particular advantages for printing form precursors that are treated in a processing apparatus that includes a system for maintaining tension on the precursor during treatment. The present method advantageously allows for all or substantially all of the area of the photopolymerizable layer to be utilized for forming the relief surface suitable for printing. The use of the leader on one or two ends of the precursor securely holds the precursor on the support surface of the processor and enables the precursor to have useable image content from edge to edge and thereby maximize the imageable area of the precursor to form a relief surface suitable for printing. The present method thus avoids or minimizes the yield loss of the precursor since an area of at least one end of the precursor no longer is captured in the grip zone, and now that area can contain relief surface with printable image content.

The present method also advantageously allows for precursors of different sizes, particularly precursors having different lengths, to be mounted securely onto a support surface of the drum by utilizing existing gripping devices, such as for example, one or more clamps, or pin arrays, or grips, that are not moveable and/or at a fixed distance from each other. The leader that is attached at one or both ends of the precursor can have different lengths for precursors having different lengths so that precursors can be mounted onto the support surface that has a fixed distance (e.g., circumferential distance on a support surface that is the exterior surface of a drum or cylinder) between the gripping devices that are used to retain each end of the composite precursor. That is, the present method can accommodate mounting of precursors having a short length by attachment to a leader having a long length, and precursors having a long length by attachment to a leader having a short length, so that the overall length of each composite printing form is the same or substantially the same and can be held at each end by gripping devices on the support surface of the processor.

The method includes providing the precursor in an extending relation with a leader, which is used to mount the precursor onto the support surface of the processor or apparatus. The leader is attached to at least one of the leading end or the trailing end of the precursor. In one embodiment, the leader is attached to the leading end of the precursor. In some other embodiments, a first leader is attached to the leading end of the precursor and a second leader is attached to the trailing end of the precursor. Embodiments having the leader attached or coupled to at least one of the leading end or trailing end of the precursor can be referred to as composite printing form precursors, or more simply referred to herein as composite precursors. Unlike the precursor, the leader is not configured for or capable of being used as printing form, i.e., is not used for printing, and does not contain a photosensitive layer or relief forming layer. In most embodiments, the leader does not include or contain any information that is or would be needed on the printing form that results from treatment of the precursor. The leader may include one or more markings and/or other information to facilitate its use in the present method.

Since it is desirable that a processor not be modified in order to be able to utilize all or substantially all of the area of the photopolymerizable layer of the precursor to form the relief printing surface, the present method accommodates use with existing gripping device/s, such as for example, one or more clamps, or pin arrays, or grips, that are used to fasten or hold the precursor to or on the support surface of the processor. In most embodiments, the support surface is a rotatable drum, which has as the existing fastening devices one or more clamps or pin arrays that are disposed transversely to the rotatable drum. In one embodiment, the The leader may be any material that has sufficient strength so that the leader can be gripped or held by the fastening device/s without tearing or pulling away from the precursor during treatment, and particularly while the precursor is held in tension to the drum. The leader should be at least resilient to conditions that occur for treatment of the precursor. For example, the leader should not melt or distort at temperatures that are used for thermal treatment of the precursor, i.e., at temperatures greater than 40° C.; or, should be chemically non-reactive to solvents and/or solutions used for washout treatment of the precursor. In most embodiments, the leader should be attached to the precursor in a manner sufficient to maintain the precursor in the desired orientation or position, and optionally under tension, on the drum or support surface during treatment, and the attachment be reversible after treatment such that the leader can be removed from the precursor.

The leader has an extending relation with the precursor since the leader projects from the one end of the precursor. The leader projects from the end of the precursor by a distance that should be at least sufficient to be captured or gripped by the existing fastening device/s that is used to secure the precursor to the drum or support surface of the processor. The leader can project from one end of the precursor by at least about 0.5 inch to about 10 inch or more (about 1.3 cm to about 25.4 cm or more). In some embodiments the leader projects about 1.5 to about 4 inch (about 3.81 cm to about 10.2 cm) from the one end of precursor. The leader has a width that can be less than, greater than, or equal to the width of the precursor. In most embodiments, the leader is coextensive widthwise with the end of the precursor.

The leader can be made of any flexible material that is conventionally used with photosensitive elements used to prepare the precursor. The leader can be single layer or multilayer. The leader can have sheet form, and in most embodiments the leader is a strip of material. Examples of suitable leader materials include polymeric films such those formed by addition polymers and linear condensation polymers. Under certain conditions metals, such as aluminum, may also be used as the leader. A preferred leader is a polyester film; particularly preferred is polyethylene terephthalate. The leader has a thickness that can be from about 0.004 to about 0.020 inch (about 0.102 mm to about 0.508 mm). In most embodiments, the thickness of the leader is 0.008 to 0.015 inch (0.203 mm to 0.381 mm).

The leader is a strip having a width that is the same or substantially the same as dimension at the end of the precursor that is held by the holding devices. In most embodiments, the leader attached to the precursor is a temporary connection that functions to sufficiently hold the ends of the precursor during treatment (and thereby allow for all or substantially all of the area of the photopolymerizable layer to be utilized for forming the relief surface suitable for printing) but can be easily separated or removed after treatment. In most embodiments, the leader is attached to the end of the precursor with an adhesive, particularly an adhesive tape. Similar to the leader, the adhesive should have sufficient strength and resilience to conditions that occur during treatment of the precursor. In some embodiments in which the composite precursor is treated by thermal development, the adherence of the adhesive to the leader and precursor is not affected at the temperature at which thermal treatment occurs, i.e., 40° C. to about 230° C. The adhesive tape and the leader can be separate elements that are brought together with the precursor to form the composite precursor. Alternatively, the leader can include at its end a layer of adhesive, and thus the leader and the adhesive form a unitary structure that connects to the precursor to form the composite precursor. In either case, the leader with the adhesive tape or with the adhesive layer will have an adhesive portion available for contact to the exterior surface of the precursor. In most embodiments, the adhesive or adhesive tape is shared to form a bridge between the precursor and the leader. In most embodiments, the end of the precursor will contact all or substantially all of the adhesive portion that is available to contact (i.e., that extends from or at the end of the leader) to form the bridge. In some other embodiments, provided that a sufficient connection can be made between the leader and the precursor, the end of the precursor will contact a segment of the adhesive portion that is available to contact (i.e., that extends from or at the end of the leader), and a remaining segment of the adhesive portion will not be in contact with the leader or the precursor. The joint formed between the leader and the precursor is not particularly limited and includes overlap joints and butt joints. In most embodiments, the leader butts or substantially abuts the end of the precursor, and can have a gap between the leader and the end of the precursor, where the gap is maintained by the adhesive tape or the adhesive portion. For some embodiments of a butt joint, the distance between the end of the precursor and the leader can be zero, in which there is no gap, to 0.06 inch (0.15 cm) gap.

In general, the adhesive tape is a bridge between the end of the precursor and an end of the leader that connects the precursor to the leader. In most embodiments, the joint formed between the precursor and the leader is bridged continuously by the adhesive tape or adhesive portion along the joint formed by the entire width of the precursor and the leader that extends from the precursor. In some embodiments, the joint formed between the precursor and the leader is discontinuously bridged by segments of the adhesive tape or adhesive portion along the joint formed by the width of the precursor and the leader that extends from the precursor. The joint between the precursor and the leader can have bridging segments of adhesive tape or adhesive portion that can be interspersed with non-taped segments that are distributed along the width of the precursor and the leader.

In other embodiments, one end of the leader that will form the joint with the precursor includes a portion of the adhesive tape pre-attached to the backside of the end of the leader. A strip of leader may be manufactured so that the adhesive tape is pre-attached to the end of the leader to facilitate attachment to the precursor. An adjacent portion of the adhesive tape that is not adhered to the leader projects from the end of the leader to reveal the adhesive layer of the tape, and forms the adhesive portion. The projecting adhesive layer is covered by a temporary release film that is removed prior to contacting the precursor to the adhesive layer that projects from the leader. In yet other embodiments, one end of the leader that will form the joint with the precursor includes a layer of an adhesive composition that forms the adhesive portion. For handling and storage of the leader the layer of the adhesive is covered by a strip of release film, which is removed prior to attachment of the leader to the precursor. In this embodiment, the precursor resides on the adhesive layer that is supported by the leader and forms a joint that overlaps with the leader.

FIG. 1a shows one embodiment of the composite printing form precursor 10 that includes the precursor 15 having a leader 20 projecting from an end of the precursor, in which the precursor 15 and the leader 20 are coupled with the adhesive tape 25. The leader 20 includes a first end 21 and opposite the first end, a second end 22, and a back side 24. The precursor 15 includes at least the photopolymerizable layer 26 adjacent the base support 28. The base support 28 has an exterior surface 30 that is opposite the photopolymerizable layer 26. The precursor 15 has a leading end 31 and a trailing end 32 that in this context refers to the orientation of the precursor as the precursor is being processed on a support surface, such as, for example, a drum, a roller, or a conveying means such as a continuous loop or belt, in the processor. Once mounted in the processor for treating, the back side 24 of the leader 20 and the exterior surface 30 of the base support 28 of the precursor 15 will come into contact with the support surface of the processor. In the embodiment shown, the leader 20 is coupled to the precursor 15 by the adhesive tape 25 in which the adhesive contacts the back side 24 of the second end 22 of the leader 20 and the exterior surface 30 of the base support 28 at the leading end 31 of the precursor 15. The adhesive tape 25 bridges a joint 35 formed between the second end 22 of the leader 20 and the leading end 31 of the precursor 15. In the embodiment shown, the joint 35 is a butt joint.

Figure 1B:
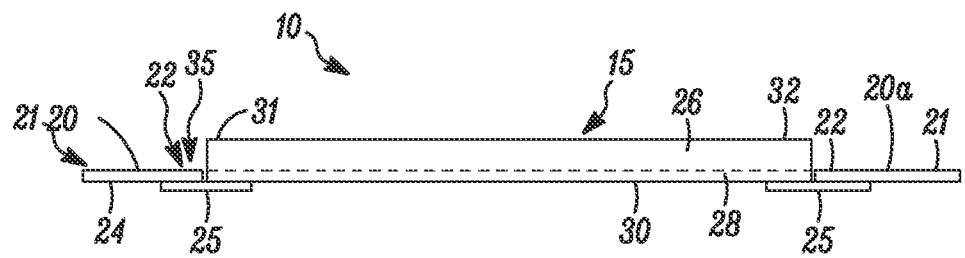
FIG. 1b is a side elevation view of another embodiment of a printing plate precursor having a first leader that projects from and attaches with an adhesive tape to first end of the precursor, and a second leader that projects from and attaches with an adhesive tape to a second end of the precursor that is opposite the first end. The first end of the precursor may be a leading end or a trailing end, and thus the second end of the precursor may be a trailing end or a leading end respectively.
Figure 2:
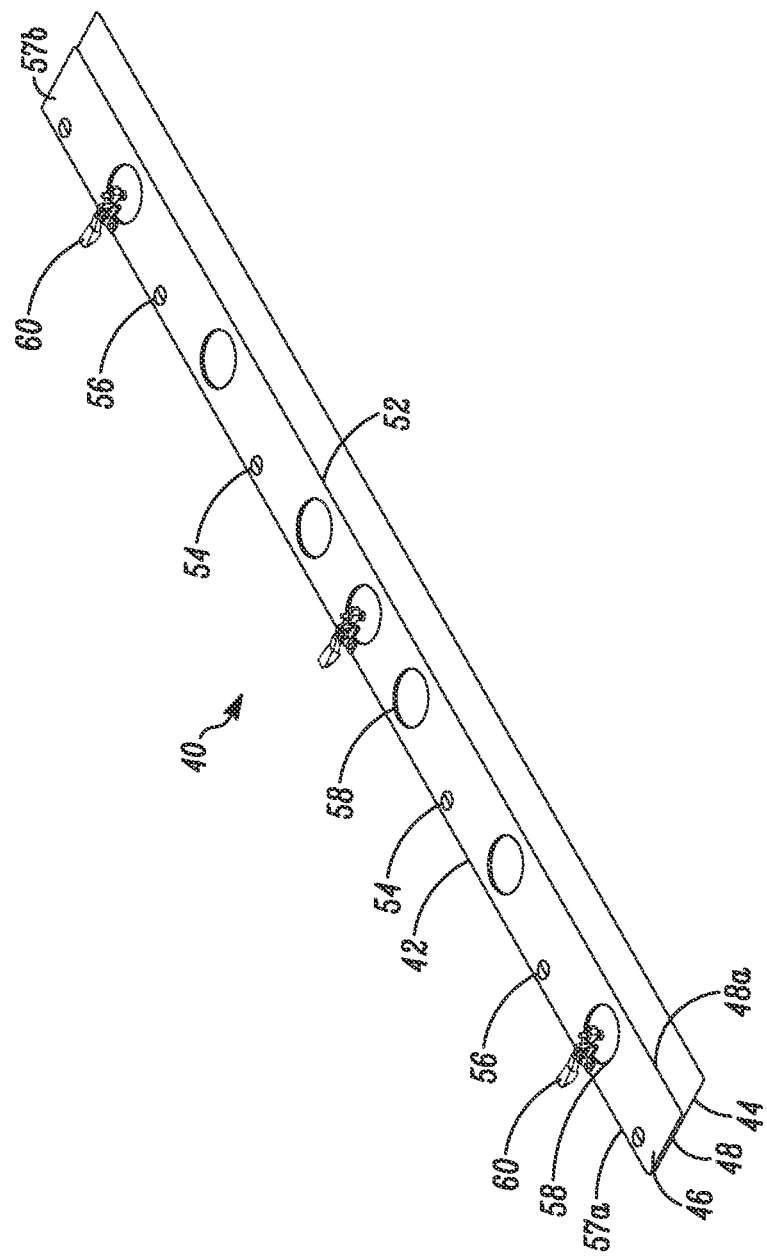
FIG. 2 is a perspective view of one embodiment of a fixture assembly suitable for facilitating the attachment of the leader to the end of the precursor.
Figure 3A:
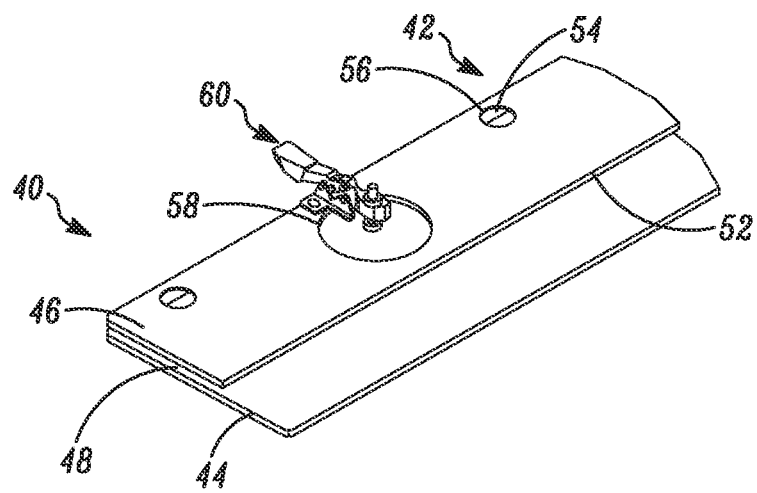
FIG. 3a is a close-up perspective view of a segment of the fixture assembly shown in FIG. 2.
Figure 3B:
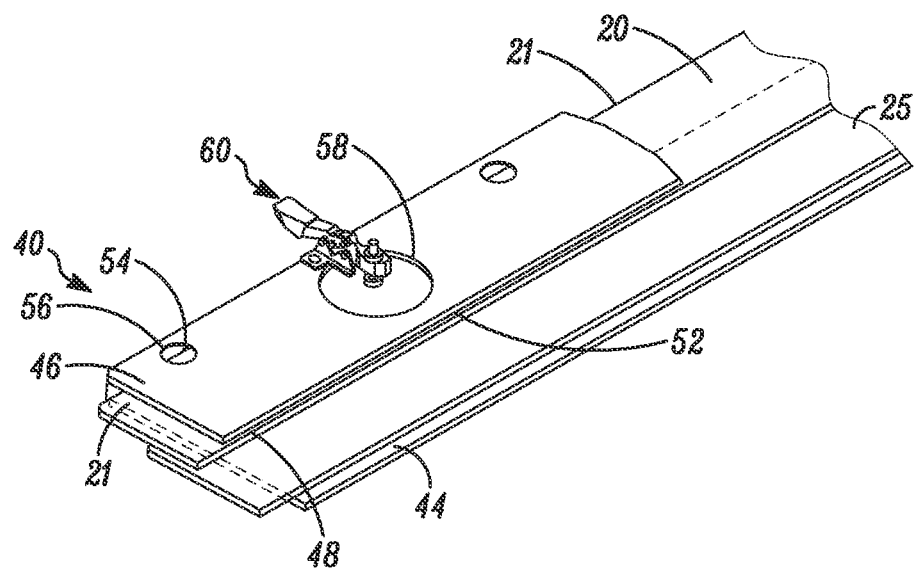
FIG. 3b is a close-up perspective view of a segment of the fixture assembly shown in FIG. 2 showing a portion of one embodiment of the leader inserted into a slot in a housing of the fixture assembly.

FIG. 1b shows another embodiment of a composite printing form precursor 10 that includes the precursor 15 having a first leader 20 projecting from a first end that is the leading end 31 of the precursor; and, a second leader 20a projecting from a second end that is the trailing end 32 of the precursor. Each of the leading end 31 and the trailing end 32 of the precursor 15 are coupled by the adhesive tape 25 to the first leader 20 and the second leader 20a, respectively. In both embodiments shown in FIG. 1a and FIG. 1b, the leader 20 is connected to the precursor 15 so that the leader aligns with and extends from the end 31, 32 of the precursor, and thus the leader is an extension of the precursor. In both embodiments, the joint formed between the precursor 15 and the leader 20 is bridged continuously by the adhesive tape 25 along the entire width of the precursor and the leader that extends from the precursor. That is, the adhesive tape 25 is a continuous strip that bridges the end of the precursor 15 to an end of the leader 20, and connects the leader to the precursor.

In the embodiment shown, the strip of leader 20 includes the adhesive tape 25 that is pre-attached to the end (i.e., second end 22) of the leader to facilitate attachment to the precursor 15. In this embodiment, a portion of the adhesive on the tape is adhered to the back side 24 of the end 22 of the leader 20, and the adhesive on an adjacent portion of the adhesive tape 25 that will contact the precursor is covered by a strip of a release film (not shown). The adhesive tape 25 is coupled to the leader 20 and projects from the second end 22 of the leader 20. The pre-attached leader may be stored as roll or precut into strips of suitable length.

The attachment of the end of the precursor 15 to the leader 20 can be further facilitated by use of a fixture assembly 40 that aligns the leader 20 to the precursor 15 prior to attachment or contact of the adhesive tape 25 to the precursor. It can be cumbersome to couple the leader 20 to the printing plate precursor 15, since the precursor can be difficult to manipulate due to its large size, e.g., up to 50 inch by 80 inch, and/or its weight that is primarily from a thick layer of the photopolymerizable material. And in order to take advantage of automated mounting into a processor, the leader 20 should be coupled to the precursor 15 with at least a leading edge of first end 21 of leader 20 oriented parallel or substantially parallel to a leading edge of the leading end 31 of the precursor 15. This assures that the precursor 15 will mount squarely to a support surface of the processor. In some other embodiments in which tension is maintained on the precursor 15 during treatment, the end 21 of the leaders 20, 20a that are attached to each of the leading end 31 and trailing end 32 of the precursor 15 are parallel or substantially parallel to each respective end of the precursor. This orientation of the leader 20 to the precursor 15 facilitates the alignment of the precursor on the support surface of the processor and assures that the precursor 15 can be held in tension on the support surface of the processor without inducing undue stress or torsion on the precursor, particularly during thermal treatment.

Shown in FIG. 2, FIG. 3a, FIG. 3b, and FIG. 4 is one embodiment of a fixture assembly 40 suitable for facilitating the attachment of the leader 20 to the end 31 of the precursor 15. The fixture assembly 40 includes a housing 42 for temporarily stationing the leader 20 so that one of the leading end or trailing end of the precursor can be attached in the desired orientation. Once the precursor 15 is attached to the leader 20 to form the composite precursor 10, the fixture assembly is no longer needed and removed. The housing 42 includes a base 44 and an upper fixture plate 46 adjacent to and separated from the base 44 forming a slot 48 that has an opening 48a into which the first end 21 of the leader 20 can be inserted. The housing 42 is made of metal, such as stainless steel or aluminum. The base 44 is connected to the upper fixture plate 46 on a side of the housing 42 that is opposite the slot opening 48a. The base 44 is wider than the upper fixture plate 46 such that the base 44 extends from a front edge 52 of the upper fixture plate 46. The front edge 52 of the upper fixture plate 46 provides an alignment edge 52 for the precursor 15 when being coupled to the leader 20. The base 44 includes a registration indicator or mark 54, which may be a permanent marking, or a raised edge or shoulder, or a groove formed in the base. The registration indicator 54 is parallel or substantially parallel to the front edge 52 that aligns the precursor. The upper fixture plate 46 includes at least two, and preferably more, windows 56 for viewing the registration indicator 54 on the base 44. The plurality of viewing windows 56 is distributed along a length of upper fixture plate 46 which are positioned above the registration indicator 54. In the embodiment having only two viewing windows 56, each viewing window 56 should be near opposing ends 57a, 57b of the length of the upper fixture plate 46. The upper fixture plate 46 also includes a plurality of orifices 58 through which the leader 20 can be contacted. Mounted to the housing 42 are at least two hold down devices 60. In most embodiments, a hold down device 60 is positioned adjacent to each of the orifices 58, so that a finger 64 of the hold down device 60 can be positioned in the orifice 48 to contact the leader 20 that is inserted into the slot 48.

Figure 4:
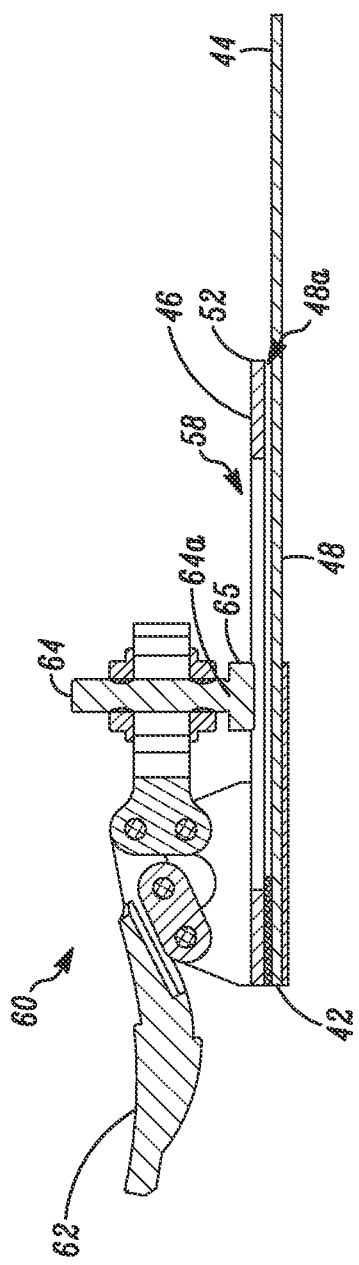
FIG. 4 is a cross-sectional view of a hold-down device that is associated with the fixture assembly.

As shown in FIG. 4, the hold down device 60 includes a lever 62 and a finger 64, which are connected to each other through a linkage that allows the lever 62 to move so as to move the finger 64 toward and away from the upper fixture plate 46. As shown in FIG. 4, the lever 62 is positioned to pivot the finger 64 into the orifice 58 of the upper fixture plate 46. Lifting the lever 62 raises or pivots the finger 64 out of the orifice 58. The finger 64 has a contact end 64 that includes a rubber cap 65 that contacts the leader 20 when positioned in the housing 42 and aids in securely holding the leader 20 in place for alignment and connection to the precursor 15.

In most embodiments, the fixture assembly 40 that is used to station the leader 20 for attachment of the leader to an end 31, 32 of the precursor 15 is placed on a flat work surface, such as a table or work cart, that can accommodate the entirety of the precursor 15. The precursor 15 lays flat with the base support 28 on the work surface (i.e., the side of the precursor 15 with the photopolymerizable layer 26 facing up). The leader 20 may be cut to a dimension that is the same as or substantially the same as the width of the precursor 15. In most embodiments, the leader 20 has a cut dimension, i.e., length that is a few inches longer than the width of the precursor 15. After attaching the leader 20 to the precursor 15, any excess length of leader 20 can be trimmed away so that a side edge of the leader 20 is flush with a side edge of the precursor 15. The leader 20 is oriented with its back side 24 (with the adhesive tape 25 pre-attached to the second end 22 of the leader 20) on the work surface.

The first end 21 of the leader 20 is inserted into the opening 48a of the housing 42 and is slid into the slot 48 until a leading edge of the first end 21 is aligned to the registration indicator or mark 54 which is seen through the viewing windows 56. In one embodiment, the registration mark 54 is a raised surface in the base 44 and the leader 21 is slid into the slot 48 until the edge of the first end 21 abuts the raised surface of the registration mark. The one or more orifices 58 can be used to manually assist the leader 20 to slide into the slot 48 and/or to manually hold the end 21 of the leader 20 in position to align with the registration indicator 54. While assuring that the leader 20 is aligned to the registration mark 54, the lever 62 on each hold down device 60 is moved to bring the end 64a of the finger 64 in contact with the leader 20. For each hold down device 60, the lever 62 is moved so that the finger 64 moves into the adjacent orifice 58 and the cap 65 on the finger 64 contacts a portion of the first end 21 of the leader 20 that is positioned in the slot 48 and underlies the adjacent orifice 58. The contact of the finger 64 of each of the hold down devices 60 to the leader 20 maintains the alignment position of the leader 20 during attachment to the precursor 15. The second end 22 of the leader 20 that includes the adhesive tape 25 extends from the slot opening 48a. In one embodiment, a portion of the adhesive tape 25 that extends from the second end 22 of the leader has the adhesive layer exposed or uncovered. In another embodiment, a portion of the adhesive tape 25 that extends from the second end 22 of the leader 20 is covered by a strip of release film (not shown).

The precursor 15 is brought adjacent to the fixture assembly 60 and positioned so that the end 31 (or 32) of the precursor is adjacent and butts evenly against the front edge 52 of the upper fixture plate 46, i.e., the alignment edge. The end 31 of the precursor 15 resides on the portion of the adhesive tape 25 with the cover of release film. Optionally, an exterior surface 30 the base support 28 at or near the end 31 of the precursor 15 that will contact the extended portion of adhesive tape 25 (i.e., the uncovered adhesive layer or the adhesive covered with the release film) may be cleaned and or wiped to remove any handling oils or other contamination that may interfere with secure attachment of the leader 20 to the precursor 15. In the embodiment in which the release film covers the extended portion of the adhesive tape 25, the release film is peeled from the adhesive side of the tape 25 by sliding the release film from under the end 31 of the precursor 15 and bending the film substantially perpendicular to the precursor end. As the release film is peeled from the adhesive side of the tape 25, the exterior surface 30 of the base support 28 at the end 31 of the precursor 15 contacts the uncovered portion of the adhesive layer of the tape 25. The precursor 15 can be manually pressed firmly into contact with the uncovered adhesive. The precursor 15 lifts only slightly as the release film continues to be peeled from the adhesive tape 25, so that the precursor 15 can return to its alignment position and the exterior surface 30 of the precursor base support 28 contacts the uncovered adhesive side of the tape 25. After the release film is completely removed, the end 31 of the precursor 15 contacting the uncovered adhesive side of the tape 25 can be manually pressed to secure the precursor end 31 to the adhesive (and to the leader 20). Thus, at least one of the leading end 31 or the trailing end 32 of the precursor 15 is attached to a leader 20 to facilitate mounting or holding the precursor onto a support surface for treatment, while providing the capability to fully utilize the surface area of the precursor with printing image. The lever 62 on each of the hold down devices 60 is moved, raising the end 64a of the finger 64 that contacts the leader 20, and the leader 20 is removed from the housing 42 of the fixture assembly 40. The leader 20 is now attached to and extends from the end 31 (or 32) of the precursor 15, with at least a leading edge of first end 21 of leader 20 oriented parallel or substantially parallel to a leading edge of the leading end 31 of the precursor 15.

Figure 5:
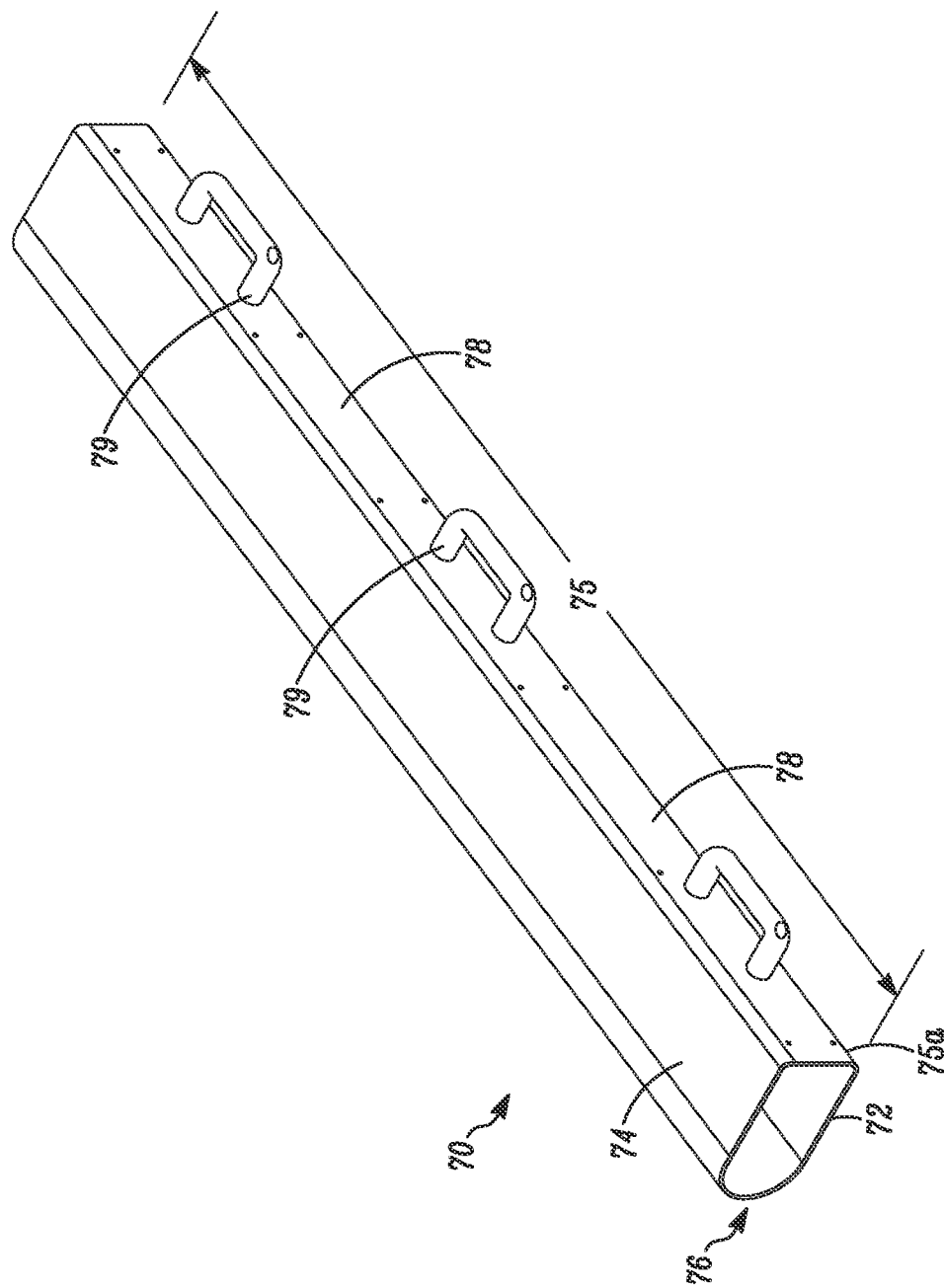
FIG. 5 is a perspective view of one embodiment of a bolster member having a U-shaped region with a flat segment suitable for locating the end of the precursor with the leader attached to enhance contact of adhesive onto a backside of the precursor.
Figure 6A:
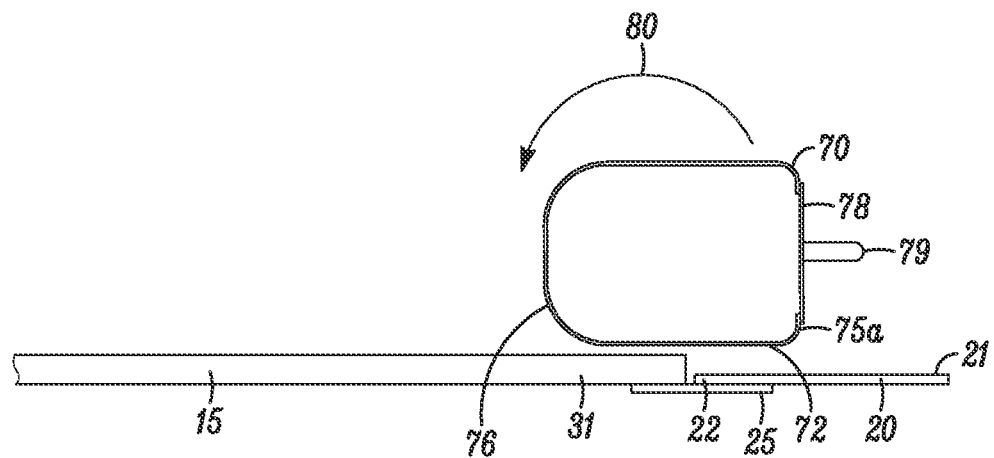
FIG. 6a is a cross-sectional view of a bolster member shown in FIG. 5 in position near an end of the precursor that is coupled by adhesive tape to the leader, in preparation for enhancing contact of the precursor to the adhesive tape.
Figure 6B:
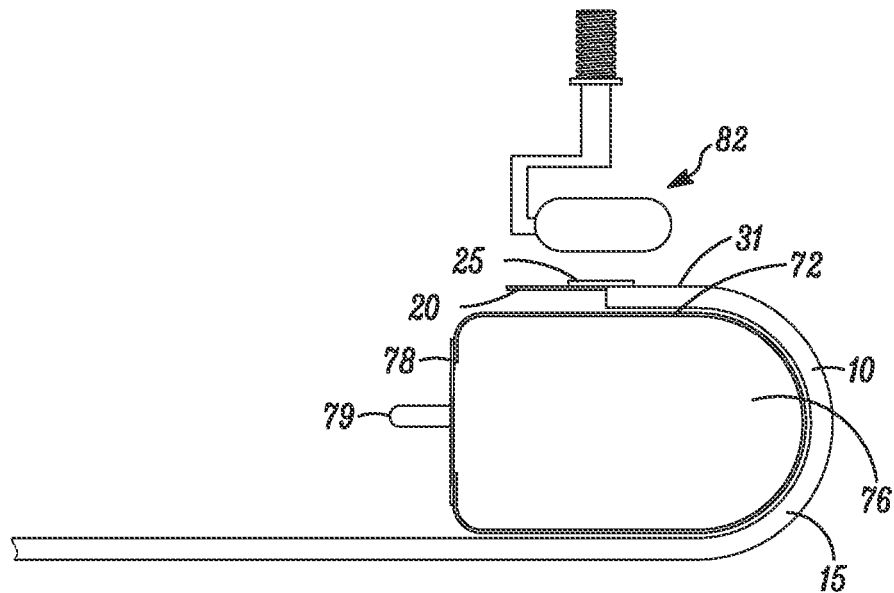
FIG. 6b is a cross-sectional view of a bolster member shown in FIG. 5, which additionally shows the precursor wrapped about the U-shaped region of the bolster member so that the end of the precursor that is attached to the leader with adhesive tape resides on the flat segment.

Optionally, additional steps can be conducted after the leader 20 is attached with the adhesive tape 25 to the precursor 15 to assure that the leader is sufficiently attached to the end of the precursor. In some embodiments of the leader 20 attached to the end 31 of the precursor 15, air may be trapped at the interface between the adhesive and the exterior surface 30 of the precursor base support 28. FIG. 5, FIG. 6a, and FIG. 6b show one embodiment of a bolster member 70 that is suitable for use with the precursor 15 attached with an adhesive tape 25 to the leader 20 in order to enhance contact of the adhesive to the end 31 of the precursor 15. The bolster member 70 is tubular-like structure having a length 75 and an exterior surface 74 that includes a U-shaped region 76 and a planar region 78. In the embodiment shown, the bolster member 70 includes one or more handles 79 for carrying. A segment of the U-shaped region 76 of the bolster member 70 has a radius or arc that permits wrapping of a portion of the printing form precursor 15, with the photopolymerizable layer 26 facing the exterior surface 74 of the bolster member 70, without cracking, creasing, or otherwise disturbing the surface and/or the layers of the precursor 15. Since in some embodiments the photopolymerizable layer 26 can have thickness from about 0.005 inch to about 0.250 inch or greater (0.013 to 0.64 cm or greater), the radius or arc of U-shaped region 76 of the bolster member 70 is sized to allow its use for various precursors that have different thickness to wrap and conform to its shape. The bolster member 70 is made from material, such as stainless steel, that has strength and rigidity sufficient to support pressure applied manually by a roller 80 against the end 31 of the precursor 15 with the leader 20 attached.

To enhance contact of the adhesive tape 25 to the precursor 15 and assure that the leader 20 is securely attached to the precursor 15, as shown in FIG. 6a and FIG. 6b, the bolster member 70 is placed near the end 31 of the precursor 15 that has the leader 20 attached, with a straight edge 75a along the length 75 of the bolster member 70 aligned with the first end 21 of the leader 20, and is oriented so that a planar segment 72 of the U-shaped region 76 is on a side of the precursor 15 that has the photopolymerizable layer 26 (i.e., opposite the exterior surface 30 of the base support 28) and the U-shaped region 76 faces away from the end 31 of the precursor having the leader 20 attached. The U-shaped region 76 of the bolster member 70 is rotated in the direction of arrow 80 on the precursor 15 and away from the leader 20. The bolster member 70 is rotated approximately 180 degrees such that the planar segment 72 is uppermost and forms a platform suitable for the joint 35 of the adhesive tape 25 and the precursor 15 (and leader 20 if necessary) to reside and to support the application of pressure with a roller 82. The roller 82 includes a handle and a cylinder or roll that rotates. Either concurrent with the rotation of the bolder member 70, or sequentially after the bolster member 70 is rotated; the precursor 15 is wrapped about the U-shaped region 76. Once wrapped, the side of the precursor 15 with the photopolymerizable layer 26 is adjacent the exterior surface 74 of the bolster member 70, and the end 31 of the precursor 15 with the attached leader 20 is positioned on the uppermost planar segment 72 of the U-shaped region 76, of the bolster member 70. The end 31 of the precursor 15 that contacts the adhesive tape 25 resides on the uppermost planar segment 72 of the U-shaped region 76 of the bolster member 70. The end 31 of the precursor 15 with the attached leader 20 is held in place on the planar segment 72, while manually moving the hand-held roller 82 with pressure on a side of the tape 25 opposite the adhesive side and at the location where the adhesive contacts the exterior surface 30 of the base support 28 of the precursor 15. The roller 82 moves on the contact location of the adhesive portion and the precursor, across the width of the composite precursor 10. Moving the roller 82 to rotate the roll and apply firm pressure along the adhesive tape 25 burnishes the contact location, i.e., joint 35, of the adhesive tape 25 to the precursor 15 and the leader 20, removing trapped air bubbles and assuring secure contact with the tape adhesive. The precursor 15 is returned flat on the work surface, the bolster member 70 is removed, and the precursor 15 now with the leader 20 securely attached is ready for mounting in a processor for treatment.

In some embodiments as shown in FIG. 1b, a first leader 20 is attached to the leading end 31 and a second leader 20a is attached to the trailing end 32 of the precursor 15, so that both ends 31, 32 of the precursor 15 can be held to the support surface of the processor and the precursor is in tension during treatment. In one embodiment, the steps described above with reference to use of the fixture assembly 40 to attach a leader 20 to one end of the precursor 15, and optionally with reference to the use of the bolster member 70 to enhance contact between the end 31 of the precursor 15 and the adhesive tape 25, can be repeated with the second leader 20a and the opposite end 32 of the precursor 15 to attach and enhance contact of the second leader to precursor.

According to an advantage of the present method, the composite precursor 10 allows for all or substantially all, i.e., entire, of the area of the photopolymerizable layer 26 of the precursor 15 to be available to form a relief surface for printing. That is, the relief surface that is made of the polymerized portions of the photopolymerizable layer can be fully utilized as the printing surface of the plate (from the leading edge to the trailing edge and across the width from side edge to side edge). The present method provides for at least about 90 to 100 percent of the area of the photopolymerizable layer of the precursor to be utilized to form a relief surface suitable for printing. In some embodiments, the area of the relief surface used for printing by the printing plate prepared according to the present method is greater than 90% of the area of the photopolymerizable layer of the precursor. In some other embodiments, the area of the relief surface used for printing by the printing plate prepared according to the present method is greater than 94% of the area of the photopolymerizable layer of the precursor, i.e., 94 to 100 percent of the photopolymerizable area forms relief surface for printing. In other embodiments, the area of the relief surface used for printing by the printing plate prepared according to the present method is greater than 97% of the area of the photopolymerizable layer of the precursor i.e., 97 to 100 percent of the photopolymerizable area forms relief surface for printing. In yet other embodiments, the area of the relief surface used for printing by the printing plate prepared according to the present method is greater than 99% of the area of the photopolymerizable layer of the precursor i.e., 99 to 100 percent of the photopolymerizable area forms relief surface for printing.

Following overall exposure to actinic radiation through an image-bearing mask, the photosensitive element is treated to remove unpolymerized areas of the photopolymerizable layer and thereby form a relief surface. Treatment of the photosensitive element can include (1) "wet" development wherein the photopolymerizable layer is contacted with a suitable developer solution to washout unpolymerized areas and (2) "dry" development wherein the photopolymerizable layer is heated to a development temperature which causes the unpolymerized areas to melt or soften and is contacted with an absorbent material to wick away or remove the unpolymerized material. Dry development may also be called thermal development.

Wet development is usually carried out at about room temperature. The developer solution can include an organic solvent, an aqueous or a semi-aqueous solution, or water. The choice of the developer solution will depend primarily on the chemical nature of the photopolymerizable composition to be removed. A suitable organic solvent developer includes an aromatic or an aliphatic hydrocarbon, an aliphatic or an aromatic halohydrocarbon solvent, or a mixture of such solvents with a suitable alcohol. Other organic solvent developers have been disclosed in published German Application 38 28 551. A suitable semi-aqueous developer can contain water and a water miscible organic solvent and an alkaline material. A suitable aqueous developer can contain water and an alkaline material. Other suitable aqueous developer solution combinations are described in U.S. Pat. No. 3,796,602.

Development time can vary, but it is preferably in the range of about 2 to about 25 minutes. The developer solution can be applied in any convenient manner, including immersion, spraying, and brush or roller application. Brushing aids can be used to remove the unpolymerized portions of the photosensitive element. Washout can be carried out in an automatic processing unit which uses developer and mechanical brushing action to remove the unexposed portions of the resulting precursor, leaving a relief structure of the exposed image pattern and the floor.

Following treatment by developing in solution, the precursors are generally blotted or wiped dry, and then more fully dried in a forced air or infrared oven. Drying times and temperatures may vary, however, typically the precursor can be dried for about 60 minutes to about 120 minutes at about 60° C.

Treating the photosensitive element thermally includes heating the photopolymerizable layer to a development temperature above about 40° C. which causes the unpolymerized areas to liquefy, that is, to melt, soften, or flow. The photopolymerizable layer is capable of partially liquefying upon thermal development, that is, the uncured or unpolymerized material softens or melts or flows at a reasonable processing or developing temperature. The polymerized areas of the photopolymerizable layer have a higher melting temperature than the unpolymerized areas and therefore do not melt at the development temperatures (see U.S. Pat. No. 5,215,859 and WO 98/13730). If the photosensitive element includes one or more additional layers on the photopolymerizable layer, it is desirable (but not necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures.

The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. Nos. 3,060,023; 3,264,103; 5,015,556; 5,175,072; 5,215,859; 5,279,697; 6,797,454, 8,459,182; and 8,397,636. In most embodiments, the unpolymerized portions or uncured portions are removed by contacting an outermost surface of the element to an absorbent surface, such as a development medium, to absorb or wick away or blot the melt or soften portions. It is contemplated that a combination of wet and dry treatments can be used to prepare the photosensitive element into a printing form. For example, one or more layers, such as the mask, on the exposed photosensitive element could be removed by wet development, and then the photosensitive element undergoes thermal treatment to remove the unpolymerized portions of the photopolymerizable layer.

The term "melt" is used to describe the behavior of the un-irradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated un-irradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together. Apparatuses suitable for thermal development of photosensitive elements are disclosed in U.S. Pat. Nos. 5,279,697 and 6,797,454.

The development medium is selected to have a melt temperature exceeding the melt or softening or liquefying temperature of the unirradiated or uncured portions of the radiation curable composition and having good tear resistance at the same operating temperatures. The selected material withstands temperatures required to process the photosensitive element during heating. The development medium may also be referred to herein as development material, absorbent material, absorbent web, and web. The development medium should also possess absorbency for the molten elastomeric composition. The development medium is selected from non-woven materials, paper stocks, fibrous woven material, open-celled foam materials, porous materials that contain more or less a substantial fraction of their included volume as void volume. The development medium can be in web or sheet form. In some embodiments, the development medium is a non-woven web of nylon or a non-woven web of polyester.

DuPont has sold flexographic relief printing plates under the trade name CYREL® and has sold equipment for manufacturing the relief plates under the trade name CYREL® and CYREL® FAST. Embodiments for treatment of the precursor include processors for washout development of photosensitive elements with a solution, and, processors for thermal development of photosensitive elements. The present method can be used to the extent that washout development processors include means for transporting the photosensitive element that prevents full or substantially full utilization of the area of the photopolymerizable layer to form the relief surface suitable for printing. It should be understood that the present method can be used in conjunction with any existing treatment processors with the modification that instead of the end of the precursor being directly retained, that at least the first end of the leader is retained and secured to the support surface of the processor, preferably in the same manner and by the existing fastening device/s.

Thermal processing equipment for preparing the flexographic relief printing plates can have a rotatable drum as the support surface about which the plate precursor is disposed. For example, processors for thermal development may have rotatable drums about which the printing plate precursors must be secured. One such processor is described in U.S. Pat. No. 5,279,697. As disclosed in U.S. Pat. No. 5,279,697, an automated process and apparatus can be used for handling an irradiated printing form and heating and pressing the print form to remove the unirradiated composition from the printing form. As disclosed in U.S. Pat. No. 5,279,697, the printing form is secured to a preheating drum with a clamp flush mounted transversely on an outer surface of the drum. Another method and apparatus for thermal processing a printing form is disclosed in U.S. Pat. No. 6,797,454 B1. The apparatus disclosed in the publication includes a drum having a metallic surface that is coated with a thin tackification coating that temporarily adheres the photosensitive printing form to the drum. Although the drum includes a tacky surface to hold the plate to the drum, the degree of tack at times can be insufficient to prevent the printing form from slipping or moving from the drum surface.

Particularly suitable thermal processors for use with the present invention are disclosed by Odle et al. in U.S. Pat. No. 8,459,182 and by Frentzel, Jr. et al. in U.S. Pat. No. 8,397,636 which are hereby incorporated by reference in their entirety herein. Particularly incorporated herein from U.S. Pat. No. 8,459,182 are the Drawings, the Description of the Drawings, and the Detailed Description of the Illustrative Embodiments from column 5, line 5 through column 23, line 43; specifically, the description of the thermal development system from column 5, line 56 through column 10, line 57; and more specifically, the description of the Printing form Securing Subsystem in column 10, line 58 through column 14, line 51. Particularly incorporated herein from U.S. Pat. No. 8,397,636 are the Drawings, the Description of the Drawings, and the Detailed Description of the Illustrative Embodiments from column 5, line 5 through column 23, line 57; specifically, the description of the thermal development system from column 5, line 57 through column 10, line 57; and more specifically, the description of the Printing form Securing Subsystem in column 10, line 58 through column 14, line 60.

For one embodiment of thermal treatment by the thermal processors as disclosed in U.S. Pat. Nos. 8,459,182 and 8,397,636, the composite printing plate precursor 10 is mounted on a drum 156 with both the leading end and the trailing end of the precursor securely held to the drum so that the precursor is properly tensioned and held in contact with the drum during thermal development. The thermal processor includes a first set of pins 112 that are transversely coupled to an outer surface 188 of the drum 156, a movable member 104 that extends over a portion of the drum surface can independently rotate about the drum 156, and a second set of pins 146 that are disposed transversely on the movable member 104, and adjacent to the outer surface 188 of the drum 156. The precursor 15 having leaders 20, 20a attached that is prepared by the present method is mounted to the drum 156 with the first end 21 of the first leader 20 securely held by the first set of pins 112 and the first end 21 of a second leader 20a moving into position to be held by the second set of pins 146, wherein the precursor 15 is between the first and second leaders 20, 20a with the leading end 31 of the precursor 15 attached to the second end 22 of the first leader 20 and the trailing end 32 of the precursor 15 attached to the second end 22 of the second leader 20a.

Figure 7:
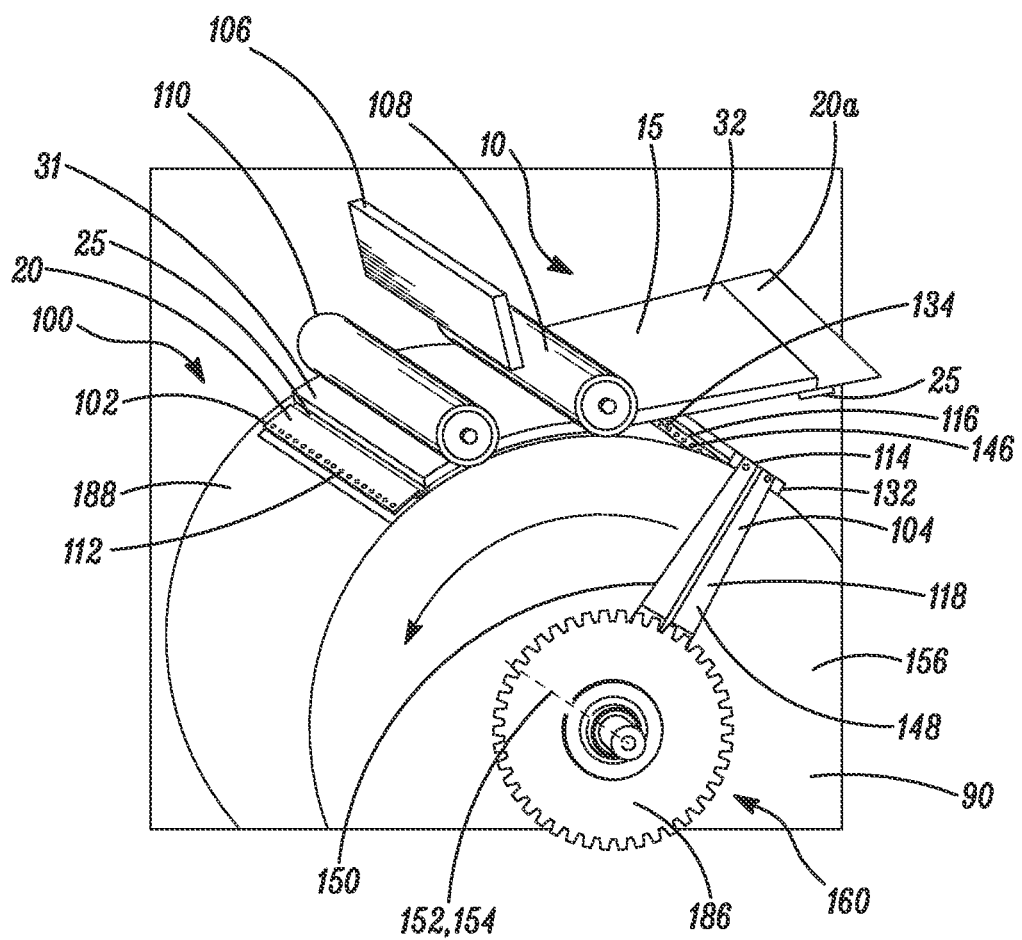
FIG. 7 is a perspective view of one embodiment of a precursor securing system of a processor, showing the leader that is attached to one end of the precursor secured to a drum as a support surface, wherein the leader is securely held to the drum by a first set of pins mounted on the drum.

Thermal treatment by the thermal processors disclosed in U.S. Pat. Nos. 8,459,182 and 8,397,636, include a printing form precursor securing subsystem 100. One embodiment of the precursor securing subsystem 100 of the thermal processor is shown in FIG. 7. The composite printing form precursor 10 is mounted on or adjacent the support surface, which is a drum 156, with the leading end 31 of the precursor 15 that is coupled to the leader 20 securely held to the drum 156, and the trailing end 32 of the precursor 15 that is coupled to the leader 20a securely held to a rotatable member 104 so that the precursor is properly tensioned and held in contact to the drum, i.e., to an outermost or circumferential surface of the drum, during thermal development.

The precursor securing subsystem 100 of the thermal processor includes the drum 156, a head pin bar 102, a rotatable member 104, a stamper bar 106, laydown rolls 108, 110, and an actuation subsystem 160 (only one drive element 186 of the actuation subsystem is shown). The drum 156 is the attachment point for the composite precursor 10 during the thermal development process. Drum 156 is also used to rotate the precursor 15 (that is coupled at its ends to the leader 20, 20a) against a web of a development medium (not shown) so that the unexposed (i.e., unpolymerized) molten polymer may be removed. Additionally, drum 156 functions to secure and create tension on the composite precursor 10, and particularly the precursor 15. Moreover, precursor securing subsystem 100 permits the system to receive precursors 15 and composite precursors 10 of different lengths because the system can be used to secure the precursor at any two circumferential points with respect to the drum.

Precursor securing subsystem 100 also includes a head pin bar 102 that is located on surface 188 of drum 156. Head pin bar 102 functions to secure the composite precursor 10 to the drum 156, by securing the leading edge of the first end 21 of the leader 20 so that the precursor 15 that is coupled to second end 22 of the leader 20 is thereby mounted to and can by extension be securely held to the drum 156. Head pin bar 102 comprises pins 112 aligned in a generally linear manner across the surface 188 of drum 156. Head pin bar 102 may include cutouts to aid in removal of the precursor 15 with the leader 20. Pins 112 function to pierce a lead portion, preferably the first end 21 of the leader 20, thereby securing the lead portion of the composite precursor 10 to the drum 156. Alternatively, the leading end 21 of the leader may have pre-formed holes and the pins 112 can be stamped through the preformed holes to secure the leading portion of the leader 20.

Pins 112 function to pierce the leader 20, or to be inserted through preformed holes in the leader 20, and secure a first portion of the composite precursor 10, i.e., the first end 21 of the leader 20 to the drum 56. The material comprising the pins is not limited providing that the pin material will maintain a piercing point sufficiently sharp to pierce printing forms and/or maintain its shape with use in securing and tensioning a plurality of printing forms. In one embodiment, pins 112 may be comprised of commercially available hardened steel dowel pins. Other materials suitable for the pins include a tool steel type of material such as 4140 or 4037 and hardened to about Rockwell 54C/58C. The tool steel material meets standard ASME B18.8.2. Other suitable materials for the pins include AISI (American Iron and Steel Institute standard) 5155, or 5155H, chromium steel quenched and tempered to a minimum surface hardness of 60 HRC; and, AISI 6150, or 6150H, chromium-vanadium steel quenched and tempered to a minimum surface hardness of 60HRC. Other types of relatively hard stainless steels may be used.

The pins 112 have pointed top portions and are spaced apart across a width (i.e., axial length) of the drum 156 in a number sufficient to securely hold the first portion of the composite precursor 10 to the drum 156 with tension during processing. In one embodiment, pins 112 have pointed top portions and are spaced approximately 0.438 inches apart across the width of the drum 156 on 0.500 inch centers. The pins are 0.0625 inches in diameter. In order to couple the pins 112 to the drum surface 188, the drum 156 has a machined slot (not shown) that runs the width of the drum 156. The pins 112 are press fit into a series of brass bars (not shown) which are then fastened by bolting into the slot in the drum 156. One of skill in the art will appreciate that the bars holding the pins (not shown) may be comprised of a wide range of semi-soft materials including aluminum or an aluminum-bronze alloy. Those of skill in the art will appreciate that the pins 112 may be coupled to the drum 56 with any of a variety of techniques. This may include attaching the pins 112 from inside the drum 156 or welding pins 112 to the surface of the drum.

To securely handle or retain the composite precursor 10, in one embodiment the pins 112 have a height above the drum surface that at least extends through the leader thickness. To securely handle or retain the precursor 15, in other embodiments the pins 112 have a height above the drum surface that extends through the precursor thickness. The pins 112 extend radially from the drum centerline and typically are sharpened on one side to an included angle of about 65 degrees (i.e., the angle of the sharpened surface is 65 degrees from a plane perpendicular to an axis of the pins 112). A person of skill in the art will appreciate that pins 112 may be shaped in multiple ways. For example, pins 112 may have an angle other than 65 degrees and may contain unsharpened top portions. Additionally, in some applications, it may be desirable to have the pins 112 at a slight angle to the tangent line to the drum surface 188 to aid the securing subsystem 100 in keeping the leader 20 coupled to the precursor 15 on the drum 156 during processing.

The securing system 100 includes the first set of pins 112 and the second set of pins 146, which comprise a means for receiving the first portion (or lead portion) and a second portion (or trail portion) of the composite precursor 10. Note that in the embodiment shown in FIG. 7, the lead portion of the composite precursor 10 is secured to pins 112 of the head pin bar 102, the composite precursor 10 is being positioned on the surface 188 of the drum 156, and the trail portion of the composite precursor 10 is being brought adjacent the second set of pins 146 of the tail pin bar 134. (The trail portion of the composite precursor 10 is not secured to the rotatable arm 104.)

The tensioning and activation subsystems can be used with the securing system 110 as described above with the first and second set of pins constituting a first and second means for receiving respectively a first and second portion of the composite precursor 10. However, the tensioning and activation subsystems can be employed with other first and second means for receiving the composite precursor 10. For example, the tensioning and activation subsystems may be used with first and second means for receiving that comprise clamps or other structure that secures the lead portion and the trail portion of the composite precursor 10 relative to the drum 156. It should be noted, however, that clamps operate substantially differently than the pins described above, as pins penetrate the material and rely on friction between the pins and the composite precursor as well as the tension on the composite precursor to secure the precursor, while clamps rely on a frictional compressive clamping force to secure the composite precursor. It is well within the skill of one in the art to contemplate suitable clamps and other structures as alternative first and second means for receiving lead portion and trail portion of the composite precursor, provided that such alternative can accommodate the printing form tensioning subsystem. It is also contemplated that a set of pins and a clamping device or other structure could be used in combination for either of the first or the second means for receiving a portion of the composite precursor 10, provided that such a combination can accommodate the precursor tensioning subsystem, i.e., can function to maintain tension on the precursor.

Printing form securing subsystem 100 further comprises rotatable member 104. Rotatable member 104 functions to assist in positioning lead portion of the composite precursor 10 to head pin bar 102. Rotatable member 104 also functions to secure a trail portion of the composite precursor 10 and to maintain tension on the precursor 15.

Rotatable member 104 comprises body 114, end 116, and arms 118. Body 114 has a generally rectangular shape with six sides: front, back, top, bottom, left side, and right side. Right side of the body 114 includes a flat edge 132 that functions to assist in securing lead portion of composite precursor 10 by aiding in the alignment of the first end 21 of the leader 20 extending from the precursor 15.

End 116 of rotatable member 104 further comprises tail pin bar 134. Tail pin bar 134 functions to secure the composite precursor 10 for tensioning with the drum 156 and secures a second portion of the composite precursor 10 by securing a leading edge of the first end 21 of the leader 20a so that the precursor 15 that is coupled to the second end 22 of the leader 22a is thereby mounted and by extension can be securely held. End 116 has generally five sides: top, bottom, front, back, and side. End 116 has a generally triangular cross-section. End 116 connects to body 114 at a side of end 116 and left side of body 114.

Tail pin bar 134 is located on end 116. Tail pin bar 134 comprises pins 146 that are aligned in a generally linear manner in the same or similar to pins 112 and generally parallel to pins 112 of head pin bar 102. Pins 146 are secured in end 116 and the top portions of pins 146 protrude out from the top of end 116. Pins 146 function to pierce the trail portion of the composite precursor 10, and preferably the first end 21 of the leader 20a, thereby securing tail portion of composite precursor 10 to rotatable member 104. Alternatively, pins 146 can be inserted or stamped through preformed holes in the leader 20a. Pins 146 may be comprised of the same material as the pins 112 or, may be made of any other suitable material as described in relation to pins 112.

The pins 146 have pointed top portions and are spaced apart across a width (i.e., axial length) of the body 114 in a number sufficient to securely hold the second portion of the composite precursor 10 to the rotatable member 104 in tension during processing. In one embodiment, pins 146 have a pointed top portion and are spaced approximately 0.438 inches apart across the width of the rotatable member 104 on 0.500 inch centers. Instead of being actually embedded into the rotatable member 104, the rotatable member 104 has a machined slot (not shown) that runs the width of the drum 156. The pins 146 are press fit into a series of brass bars (not shown) which comprise tail pin bar 134. The brass bars are then fastened by bolting into the slot in the rotatable member 104. As described above, one of skill in the art will appreciate that the bars holding the pins (not shown) may be comprised of a wide range of soft materials including aluminum and aluminum-bronze alloys.

Similar to or the same as the pins 112 of the head pin bar 102, the pins 146 of the tail pin bar 134 have a height sufficient to securely handle or retain the composite precursor, and in particular, the pins 146 have a height above the top of the rotatable member 104 that sufficiently extends through at least the leader thickness. In some embodiments the pins 146 have a height such that the thickness of the precursor 15 is seated at or below the tip end of the pins 146. The pins 146 typically extend above the top 136 of end 116 of rotatable member 104 at a height sufficient to retain or handle a printing form 22. In one embodiment, the pins 146 extend 0.250 inches above the top 136 of end 116 of rotatable member 104 in order to handle a printing form 22 up to 0.250 inches thick. In one embodiment, the pins 146 extend radially from the rotatable member 104 (based on the relative normal direction of the top surface 136 of the rotatable member 102) and typically are sharpened on one side to an included angle of about 65 degrees (i.e., the angle of the sharpened surface is 65 degrees from a plane perpendicular to the axis of the pins 146). As described above, a person of skill in the art will appreciate that pins 146 may be attached to the drum 56 and positioned and shaped in multiple ways. This may include attaching the pins 146 from inside the rotatable member 104 or welding pins 146 to the top of end 116 of rotatable member 104. Similarly, pins 146 may be positioned at angles other than 65 degrees and may contain unsharpened top portions.

Rotatable member 104 further comprises arms 118. Arms 118 function to rotate rotatable member 104 independently and separate from drum 156. The rotation of rotatable member 104 with arms 118 also assists in securing the trail portion of the composite precursor 10 to the rotatable member 104. Arms 118 comprise an inner portion 148 and outer portion 150. Arms 118 sit adjacent to each end of drum 156, but only end 90 of the drum 156 is shown. Outer portion 150 connects to body 114 of the rotatable member 104. Inner portion 148 connects the rotatable member 104 to rotatable member axis 152. Rotatable member axis 152 is congruent to drum axis 154. Drum axis 154 is defined as the axis about which drum 156 rotates. The rotatable member 104 has additional features that utilized in the printing form tensioning subsystem.

Printing form securing subsystem 100 further comprises stamper bar 106. Stamper bar 106 functions to press the ends of the leaders 20,20a of the composite precursor 10 onto head pin bar 102 and tail pin bar 134. Stamper bar 106 further includes plate engaging portion that comprises stamper bottom (not shown). In one embodiment, stamper bottom comprises a "tooth-like" surface (not shown) having apertures that corresponds to the shape and spacing of pins 112, 146. Other embodiments may include cut-outs in the shape of pins 112, 146. As stamper bar 106 engages the composite precursor 10, the stamper bar 106 presses leaders 20, 20a on to pins 112, 146. The engagement of stamper bar 106 causes pins 112, 146 to puncture the ends of leaders 20, 20a, thereby securing the lead and trail portions of the composite precursor 10 on the pins 112, 146. The stamper bar 106 may be controlled manually, but it is preferably controlled by automation. For example, a sensor may sense when the leading edge of the first end of the leader 20 is under the stamper bar 106, and send a signal to a controller, that causes the stamper bar 106 to cycle and move from a non-stamping position (shown) to a stamping position (not shown) and back to the non-stamping position. In the stamping position, the stamper bar 106 pushes the first ends 21 of the leaders 20, 20a of the composite precursor 10 through either the first or the second set of pins 112,146.

Printing form securing subsystem 100 further comprises laydown rolls 108, 110. Laydown rolls 108, 110 engage composite precursor 10 during the process of securing the composite precursor 10 to ensure that composite precursor 10 is aligned flush with the surface 188 of the drum 156. In the embodiment shown, laydown rolls 108, 110 are generally cylindrical in shape. Laydown rolls 108, 110 are affixed within printing form securing subsystem 100 in such a way that rolls 108, 110 may be in an engaged position (shown) wherein rolls 108,110 touch the composite precursor 10 and a disengaged position (not shown) wherein the rolls 108, 110 do not contact the composite precursor 10 on drum 156. While the preferred embodiment shows two laydown rolls 108, 110, it will be appreciated that only one laydown roll 110 is required for securing, tensioning, and removing composite precursor 10. It will further be appreciated that more than two laydown rolls may be used to as to further control positioning of composite precursor 10.

Printing form securing subsystem 100 further comprises drum brake (not shown). Drum brake is used during the securing process to restrict the motion of drum 156. Drum brake is preferably a shoe brake. It will be appreciated that drum brake may alternatively be a friction type disc brake, a toothed non-slip type brake, or a cylinder activated alignment pin with matching alignment hole.

Printing form precursor securing subsystem 100 further comprises actuation subsystem 160. Actuation subsystem 160 actuates the other components of printing form precursor securing subsystem 100 during the process of securing the composite precursor. Actuation subsystem 160 also actuates the tensioning subsystem.

After treating, the method includes dismounting or un-mounting composite precursor 10, i.e., the precursor 15 having one or two attached leaders 20, 20a from the support surface or drum 156 of the processor. Typically the method also includes separating the leader/s 20, 20a from the ends 31, 32 of the precursor 15, which in most embodiments is by peeling the leader 20, 20a with the adhesive tape 25 from exterior surface 30 of the base support 28 of the resulting printing plate. Other methods of separating the leader from the end of the resulting printing plate include cutting the leader flush to the end of the precursor, peeling the adhesive tape from the leader and the base support of the precursor, and lifting the adhesive tape or the leader and the adhesive tape from the base support with a tool inserted at the interface between the base support and the adhesive.

Precursor

The precursor is a photosensitive element that includes at least one layer of a photopolymerizable composition. The term "photosensitive" encompass any system in which the at least one photosensitive layer is capable of initiating a reaction or reactions, particularly photochemical reactions, upon response to actinic radiation. In some embodiments, the photosensitive element, which may be referred to herein as a precursor or printing precursor, includes a support for the photopolymerizable layer. In some embodiments, the photopolymerizable layer is an elastomeric layer that includes a binder, at least one monomer, and a photoinitiator. In some embodiments, the photosensitive element includes a layer of an infrared sensitive material which can also function as an actinic radiation opaque material adjacent the photopolymerizable layer, opposite the support.

Unless otherwise indicated, the term "photosensitive element" encompasses printing precursors capable of undergoing exposure to actinic radiation and treating to form a surface suitable for printing. It is contemplated that printing form resulting from the photosensitive element or precursor has end-use printing applications for relief printing, such as flexographic and letterpress printing. Relief printing is a method of printing in which the printing form prints from an image area, where the image area of the printing form is raised and the non-image area is depressed or recessed.

The photosensitive element includes at least one layer of a photopolymerizable composition. As used herein, the term "photopolymerizable" is intended to encompass systems that are photopolymerizable, photocrosslinkable, or both. The photopolymerizable layer is a solid elastomeric layer formed of the composition comprising a binder, at least one monomer, and a photoinitiator. The photoinitiator has sensitivity to actinic radiation, which includes ultraviolet radiation and/or visible light. The solid layer of the photopolymerizable composition is treated with one or more solutions and/or heat to form a relief suitable for flexographic printing. As used herein, the term "solid" refers to the physical state of the layer which has a definite volume and shape and resists forces that tend to alter its volume or shape. The layer of the photopolymerizable composition is solid at room temperature, which is a temperature between about 5° C. and about 30° C. The photosensitive element or precursor includes embodiments in which the photosensitive element has not been exposed to actinic radiation, as well as embodiments in which the photosensitive element has been exposed to actinic radiation. As such the photosensitive element can include embodiments in which the layer of the photopolymerizable composition includes unpolymerized portion/s; or polymerized portion/s (i.e., photohardened or cured); or both polymerized portion/s and unpolymerized portion/s.

The binder is not limited and can be a single polymer or mixture of polymers. In some embodiments, the binder is an elastomeric binder. In other embodiments, the binder becomes elastomeric upon exposure to actinic radiation. Binders include natural or synthetic polymers of conjugated diolefin hydrocarbons. In some embodiments, the binder is an elastomeric block copolymer of an A-B-A type block copolymer, where A represents a non-elastomeric block, and B represents an elastomeric block. The non-elastomeric block A can be a vinyl polymer, such as for example, polystyrene. Examples of the elastomeric block B include polybutadiene and polyisoprene. This includes, but is not limited to, elastomeric block copolymer materials such as copolymers of butadiene and styrene, copolymers of isoprene and styrene, styrene-diene-styrene triblock copolymers. Either a single elastomeric material or a combination of materials can be used for the elastomeric layer so long as the characteristics desired for relief printing are obtained.

The photopolymerizable composition contains at least one monomer, which is a compound capable of addition polymerization that is compatible with the binder to the extent that a clear, non-cloudy photosensitive layer is produced. Monomers that can be used in the photopolymerizable composition are well known in the art and include, but are not limited to, addition-polymerization ethylenically unsaturated compounds with at least one terminal ethylenic group. The composition can contain a single monomer or a combination of monomers. Monomers can be appropriately selected by one skilled in the art to provide suitable elastomeric and other properties to the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. Preferably, the photoinitiator for the main exposure (as well as post-exposure and backflash) is sensitive to visible or ultraviolet radiation, between 310 to 400 nm, and preferably 345 to 365 nm.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the printing end-use application. In some embodiments, the photosensitive layer can have a thickness from about 0.005 inch to about 0.250 inch or greater (0.013 to 0.64 cm or greater). Typical thickness of the photopolymerizable layer is from about 0.045 inches to about 0.250 inches (about 0.025 cm to about 0.64 cm).

The photosensitive element typically includes a support adjacent the layer of the photopolymerizable composition. The support can be composed of any material or combination of materials that is conventionally used with photosensitive elements used to prepare printing forms. In some embodiments, the support has a thickness from 0.002 to 0.050 inch (0.0051 to 0.127 cm).

As is well known to those of ordinary skill in the art, the precursor or photosensitive element may include one or more additional layers adjacent the photopolymerizable layer, that is, on a side of the photopolymerizable layer opposite the support. Depending on desired use, the additional layers may be opaque or transparent to actinic radiation, and may have one or more functions for the photosensitive element. The additional layers include, but are not limited to, a release layer, an elastomeric capping layer, a barrier layer, an adhesion modifying layer, a layer which alters the surface characteristics of the photosensitive element, and combinations thereof. The one or more additional layers can be removable, in whole or in part, during treatment. One or more of the additional layers may cover or only partially cover the photosensitive composition layer. It is well within the ordinary skill of those in the art to select and prepare additional layers on the photopolymerizable layer according to desired end-use. The photosensitive printing element of the present invention may further include a temporary coversheet on top of the uppermost layer of the element.

In most embodiments before treating, the photosensitive element is exposed to actinic radiation. The process of preparing a printing form from a photosensitive element usually (but not always) includes a back exposure or backflash step. This is a blanket exposure to actinic radiation through the support. It is used to create a layer of polymerized material, or a floor, on the support side of the photopolymerizable layer and to sensitize the photopolymerizable layer. The backflash exposure can take place before, after or during the other imaging steps. Any of the conventional radiation sources discussed for the overall (imagewise) actinic radiation exposure step can be used for the backflash exposure step. Exposure time generally range from a few seconds up to a few minutes.

Upon imagewise exposure, the radiation-exposed areas of the photopolymerizable layer are converted to the insoluble state with no significant polymerization or crosslinking taking place in the unexposed areas of the layer. Any conventional source of actinic radiation can be used for this exposure. The radiation sources generally emit long-wave UV radiation between 310-400 nm. The exposure time may vary from a few seconds to minutes, depending upon the intensity and spectral energy distribution of the radiation, its distance from the photosensitive element, and the nature and amount of the photopolymerizable material. Imagewise exposure can be carried out by exposing the photosensitive element through an image-bearing photomask that can be a separate film, i.e., an image-bearing transparency or phototool, or be integrated with the photosensitive element as an in-situ mask formed by computer-to-plate digital imaging.

We claim:

1. A composite printing form precursor comprising:
   a printing form precursor comprising a support, and a photopolymerizable layer adjacent to the support, the photopolymerizable layer having an area of unpolymerized portions and polymerized portions that are adapted to form a relief surface suitable for printing,
   wherein the precursor has a leading end, a trailing end, and the photopolymerizable layer adjacent the support is between the leading and trailing ends; and
   a first leader in an extending relation to one of the leading end or trailing end of the precursor, wherein the first leader has an end adhesively coupled to an exterior surface of the support that is opposite the photopolymerizable layer, and the first leader and the photopolymerizable layer do not overlap;
   wherein greater than 90% of the area of the photopolymerizable layer can be utilized to form a relief surface of the polymerized portions that are suitable for printing.

2. The composite printing form precursor of claim 1 wherein the leader and the precursor are adhesively coupled by adhesive tape having an adhesive layer that contacts the end of the leader and the exterior surface of the support of one of the leading end or trailing end of the precursor.

3. The composite printing form precursor of claim 1 further comprising:
   a second leader in an extending relation to one of the leading end or trailing end of the precursor that is opposite the end that is coupled to the first leader, wherein an end of the second leader is adhesively coupled to the exterior surface of the support that is opposite the photopolymerizable layer, and the second leader and the photopolymerizable layer do not overlap.

4. The composite printing form precursor of claim 1 wherein 100% of the area of the photopolymerizable layer can be utilized to form a relief surface of the polymerized portions that are suitable for printing.

* * * * *